United States Patent
Kirkland

(10) Patent No.: US 7,640,281 B2
(45) Date of Patent: Dec. 29, 2009

(54) DIGITAL SIGNAL CONTROL USING FIRST ORDER HOLDS

(75) Inventor: Douglas B Kirkland, Mukilteo, WA (US)

(73) Assignee: The Boeing Company, Chicago, IL (US)

( * ) Notice: Subject to any disclaimer, the term of this patent is extended or adjusted under 35 U.S.C. 154(b) by 1220 days.

(21) Appl. No.: 10/847,689

(22) Filed: May 18, 2004

(65) Prior Publication Data

US 2005/0270200 A1 Dec. 8, 2005

(51) Int. Cl.
*G06F 17/17* (2006.01)
*H03M 1/00* (2006.01)
*H03M 3/00* (2006.01)
*H03M 1/66* (2006.01)

(52) U.S. Cl. .............. 708/300; 708/313; 341/126; 341/143; 341/144

(58) Field of Classification Search .......... 708/300
See application file for complete search history.

(56) References Cited

U.S. PATENT DOCUMENTS

| | | | | |
|---|---|---|---|---|
| 3,839,675 | A * | 10/1974 | Wernikoff et al. | 375/247 |
| 4,593,271 | A * | 6/1986 | Candy | 341/131 |
| 5,594,443 | A * | 1/1997 | Lam | 341/144 |
| 5,606,319 | A * | 2/1997 | Yatim et al. | 341/144 |
| 5,786,778 | A * | 7/1998 | Adams et al. | 341/61 |
| 5,798,724 | A * | 8/1998 | Myers | 341/146 |
| 6,492,922 | B1 * | 12/2002 | New | 341/120 |

OTHER PUBLICATIONS

William B. Cleveland, "First-order-hold Interpolation Digital-toanalog converter with Application to Aircraft Simulation", Nov. 1976, NASA Technical Note, NASA TN D-8331.*

* cited by examiner

*Primary Examiner*—Lewis A Bullock, Jr.
*Assistant Examiner*—Hang Pan
(74) *Attorney, Agent, or Firm*—Harness, Dickey & Pierce, P.L.C.

(57) ABSTRACT

A method is provided to reduce delay in signal processing of a digital control system. The method includes receiving outputs from a digital controller at a first frequency. A pre-load data value is then loaded into an accumulator register and output to a digital to analog converter (DAC). In one preferred embodiment, the pre-load data value is the value of the current digital controller output. In another preferred embodiment, the pre-load data value is the value of a previous digital controller output. The method additionally includes computing a step increment value that includes the difference between the most recent value output from the digital controller and the value output by the digital controller just prior to the most recent value. The step increment value is added to the pre-load data value in the accumulator register to create an augmented value, which is then output to the DAC. At a second frequency that is greater than the first frequency, the step increment value is periodically added to the augmented value to create subsequent augmented values. The subsequent augmented values are then output to the DAC until a subsequent value is received from a digital controller at the first frequency.

8 Claims, 7 Drawing Sheets

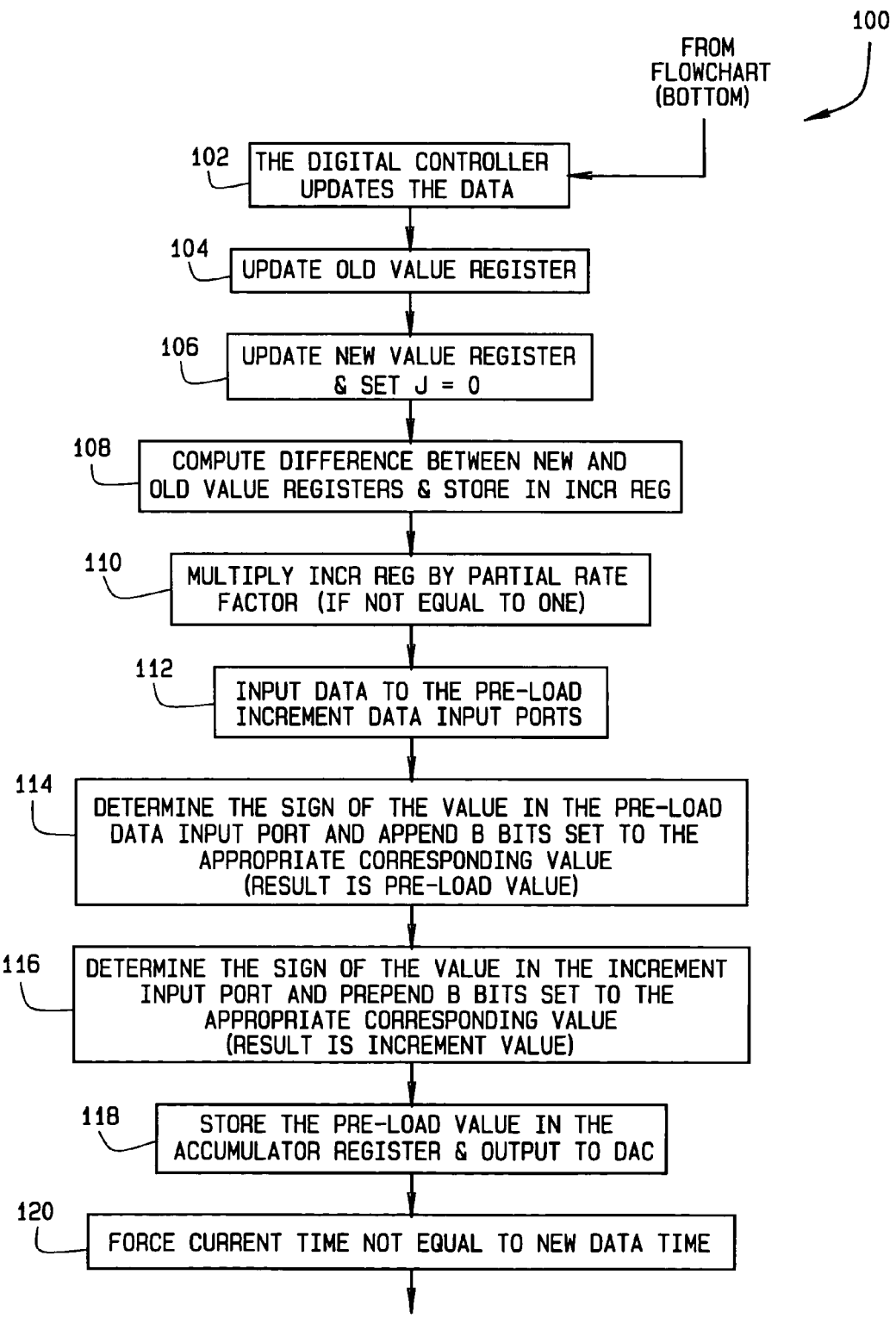
FIG. 6 (PART A)

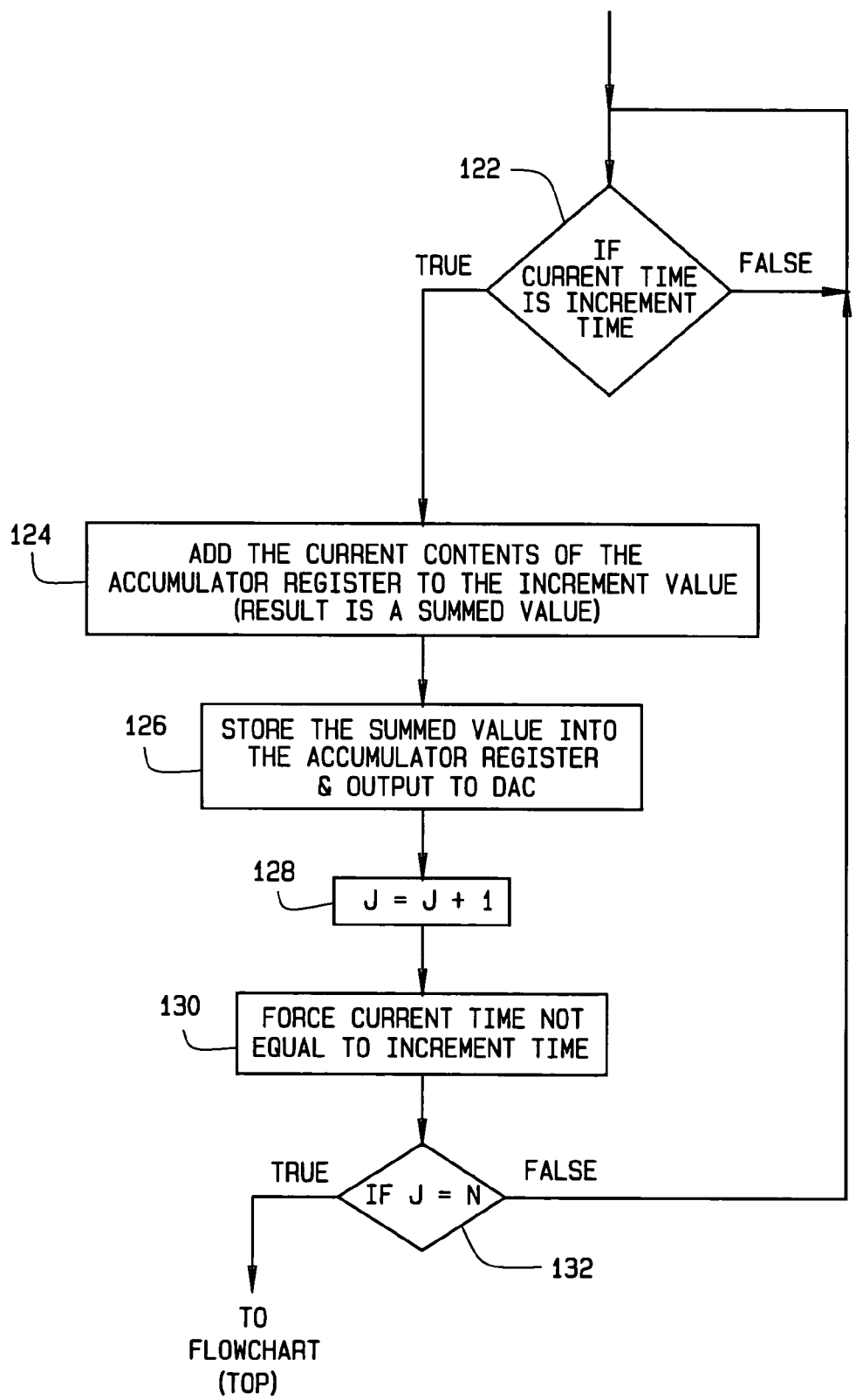
FIG. 6 (PART B)

DIGITAL SIGNAL CONTROL USING FIRST ORDER HOLDS

FIELD OF INVENTION

The invention relates generally to digital control systems. More specifically the invention relates to reducing noise and delay in digital signals output from a digital control system by combining digital up sampling with analog first order hold mechanisms.

BACKGROUND OF THE INVENTION

Digital Controllers operate by periodically sampling an analog signal, processing the sampled signal in some fashion and then outputting a control command value, which is converted to an analog signal. The control command value is typically output at the same periodic rate as the analog input signal is sampled. The output analog signal is analogous to a staircase where the width of a stair is compared to the period of the sample and the height of the stair is compared to the change in the signal from the last output to the current output. The width of the stair defines the period (frequency) of the digital noise that must be filtered and the maximum stair height defines the amplitude of the digital noise that must be filtered in order to recover a smooth output signal. However, filtering the signal typically introduces delay into the output signal. Generally, the lower the frequency of the digital noise the more delay the filter will introduce. Similarly, the larger the amplitude of the digital noise, the more delay the filter will introduce.

At least some known digital approaches provide an integrated approach to the electronic solution, however the sample rate is typically limited by considerations such as available computational bandwidth. Other known traditional digital solutions insert additional noise into the control system that must be filtered, which in turns introduces additional delays.

If the total delay in the command path becomes too large, the control process can become unstable. And, if the noise is insufficiently filtered, the noise pulses introduced can cause performance problems of the digital controller Therefore, it would be highly desirable to reduce the noise and delay in digital control systems, in order to maintain controllability, without adding significant costs.

BRIEF SUMMARY OF THE INVENTION

In a preferred implementation of the present invention a method is provided to reduce delay in signal processing of a digital control system. The method includes receiving outputs from a digital controller at a first frequency. A pre-load data value is then loaded into an accumulator register and output to a digital to analog converter (DAC). In one preferred embodiment, the pre-load data value is the value of the current digital controller output. In another preferred embodiment, the pre-load data value is the value of a previous digital controller output. The method additionally includes computing a step increment value that includes the difference between the most recent value output from the digital controller and the value output by the digital controller just prior to the most recent value. The step increment value is added to the pre-load data value in the accumulator register to create an augmented value, which is then output to the DAC. At a second frequency that is greater than the first frequency, the step increment value is periodically added to the augmented value to create subsequent augmented values. The subsequent augmented values are then output to the DAC until a subsequent value is received from a digital controller at the first frequency.

The features, functions, and advantages of the present invention can be achieved independently in various embodiments of the present inventions or may be combined in yet other embodiments.

BRIEF DESCRIPTION OF THE DRAWINGS

The present invention will become more fully understood from the detailed description and accompanying drawings, wherein;

FIG. 6 is a flow chart illustrating the basic functionality of a method for minimizing delay within the digital control system, shown in FIG. 1, utilizing first order holds in accordance with a preferred embodiment of the present invention.

DETAILED DESCRIPTION OF THE INVENTION

The following description of the preferred embodiments is merely exemplary in nature and is in no way intended to limit the invention, its application or uses. Additionally, the advantages provided by the preferred embodiments, as described below, are exemplary in nature and not all preferred embodiments provide the same advantages or the same degree of advantages.

Figure 1:
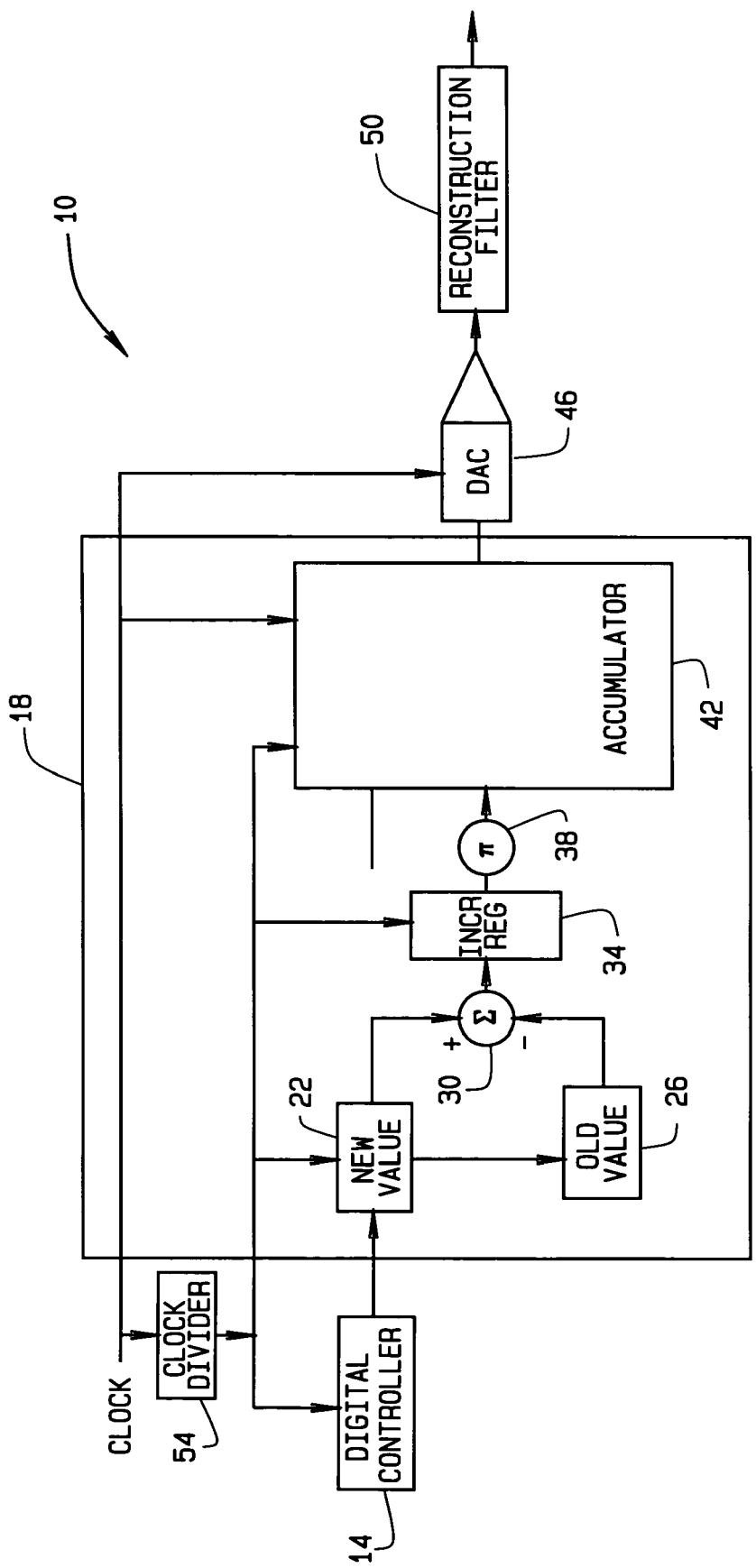
FIG. 1 is a simplified schematic of an electronically implemented digital control system, in accordance with a preferred embodiment of the present invention.

FIG. 1 illustrates a simplified schematic of an electronically implemented digital control system 10, in accordance with a preferred embodiment of the present invention. The system 10 includes a digital controller 14 that periodically outputs a digital signal to a modulation module 18. More specifically, the digital controller 14 outputs a plurality of digital signals, at a first frequency. The value of each output from the digital controller 14 is input to a new value register 22 included in the modulation module 18. The modulation module 18 further includes an old value register 26 that receives an old value from the new value register 22 when a subsequent new value, e.g. new signal, is input to the new value register 22. That is, each time the digital controller 14 outputs a signal, the value of that signal is stored in the new value register 14. The value stored in the new value register 14 relating to the previous signal output from the digital controller 14 is then considered an old value and is input to the old value register 26.

The modulation module 18 additionally includes a summer 30, an increment register 34, a multiplier 38 and an accumulator 42. The accumulator 42 can be any computational engine suitable to perform the computations of the digital control system 10, as described below. The summer 30 receives inputs from the new value register 22 and the old value register 26. The summer 30 then outputs a signal, i.e. a value, that includes the difference between the new value in the new value register 22 and the old value in the old value register 26. This summer output is input to and temporarily stored in the increment register 34 that in turn outputs a signal to the multiplier 38 that may or may not further modify the signal. The multiplier 38 then outputs a value, i.e. signal, to the accumulator 42. In addition to the signal output by the multiplier 38, the accumulator 42 receives other inputs, for example a pre-load data input. As described in detail below, the accumulator 42 utilizes all the inputs to compute an accumulator output value that is output to a digital-to-analog converter (DAC) 46. The DAC 46 converts the digital signal output from the accumulator 42 to an analog signal that is then input to a reconstruction filter 50 adapted to attenuate any noise in the analog signal output from the DAC 46. The digital control system 10 further includes a clock divider 54 that controls the timing of the inputs to the new value register 22, the old value register 26, the increment register 34, the accumulator 42 and the DAC 46.

Generally, the digital control system 10 combines digital up sampling with analog first order hold mechanisms to create a staircase approximation of various digital first order holds (DFOH) that are output to the reconstruction filter 50. The staircase output of the DFOH reduces the size of the steps and increases the fundamental frequency of the signal that is output to reconstruction filter 50. Since the step size is smaller, the reconstruction filter needs to provide less "shaping" of the signal. Also, since the frequency is larger, a corner frequency of the reconstruction filter 50 can be set at a higher frequency. These two attributes reduce the delay through the reconstruction filter 50 and provide for sufficient filtering of digital noise so that functionality of a system or device controlled by the digital control system 10, such as a servo valve, is not perturbed.

More specifically, a number of evenly spaced output samples are inserted between each of the periodic outputs of the digital controller 14. That is, evenly spaced output samples are output to the DAC 46 at a second frequency that is greater than the first frequency at which the digital controller 14 outputs signals. Each new output from the digital controller 14 is output to the DAC 46. Between each new value, i.e. signal, output from the digital controller 14, the modulation module 18 executes an insertion algorithm to determine the values output to the DAC 46 based upon the current and previous outputs of the digital controller 14.

Figure 2:
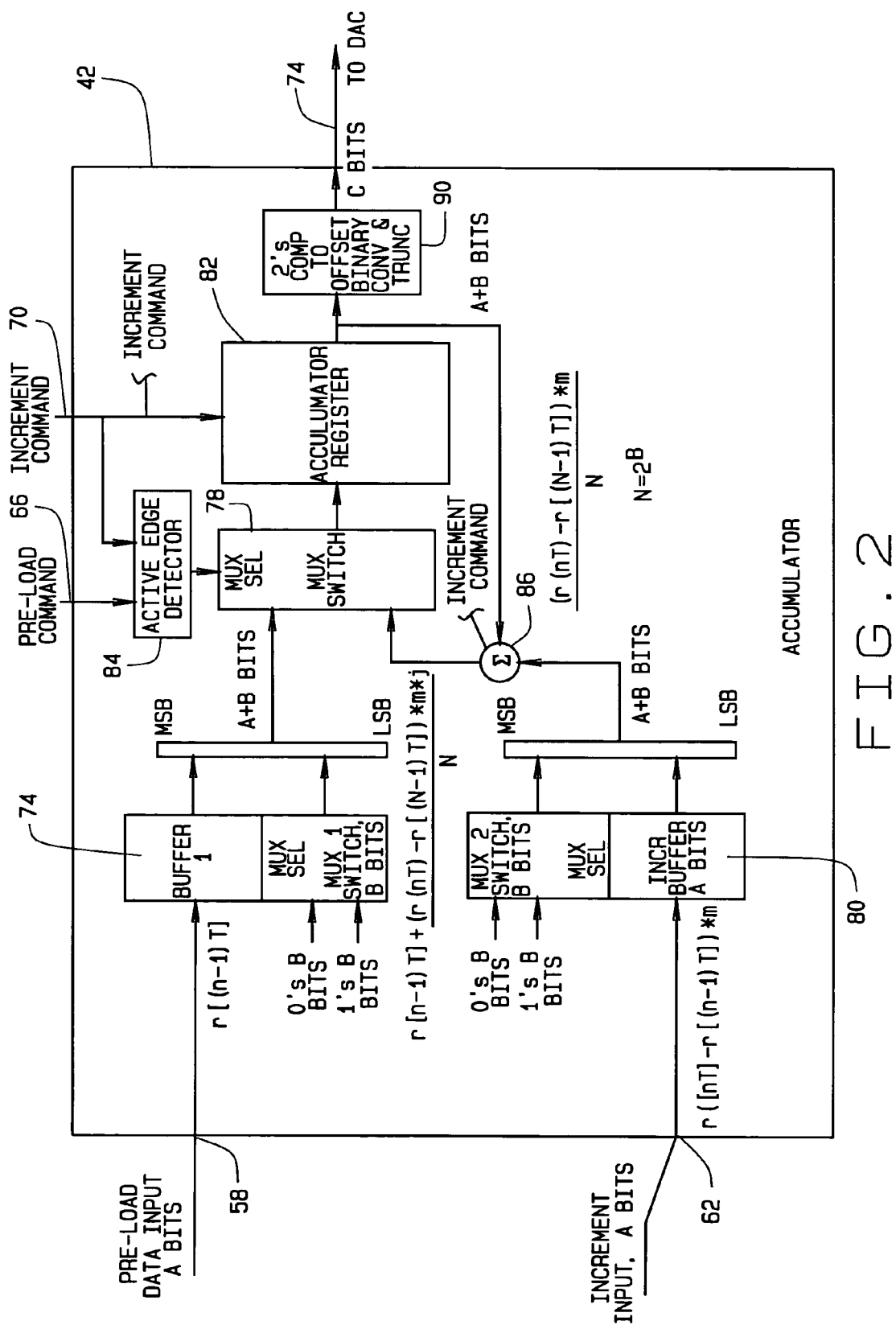
FIG. 2 is a schematic of the accumulator shown in FIG. 1.

FIG. 2 is a schematic of the accumulator 42 that includes portions of an interpolating digital first order hold difference equation to demonstrate the functionality of the accumulator 42. The accumulator 42 receives numeric two's complement bus data at a pre-load data input port 58 and an increment data input port 62. Additionally, the accumulator 42 receives a pre-load data clock signal at a pre-load command input 66 that controls the receipt of data at the pre-load data input port 58. Furthermore, the accumulator 42 receives an increment data clock signal at an increment command input 70 that controls the receipt of data at the increment data input port 62. Finally, the accumulator 42 outputs a resultant signal to the DAC 46 on a data bus 74. Generally, the pre-load data input port 58 receives a signal, i.e. value, from either the new value register 22 or the old value register 26 while the increment data input port 62 receives the difference between the value in the new value register 22 and the old value register 26.

When the data at the pre-load data input port 58 and the increment data input port 62 is updated, the accumulator 42 utilizes a first multiplexer switch 74 to determine whether the data from the pre-load data input port 58, which is a specific number 'A' bits wide, is positive or negative. The accumulator 42 then appends a specific number 'B' bits to the least significant end of the pre-load data, i.e. the data received at the pre-load data input port 58. If the sign bit is positive, all the appended bits are logical zero's, while if the sign bit is negative, the appended bits are logical one's. The result is A+B bits wide. The A+B bit wide result is then passed through a second multiplexer switch 78 that is enabled to pass new data to an accumulator register 82. After passing the new data, an active edge detector module 84 commands the second multiplexer switch 78 to receive data from an accumulator summer device 86 until the next set of new data is received at the pre-load data input port 58.

In a similar fashion, when the data at the pre-load data input port 58 and the increment data input port 62 is updated, the accumulator 18 utilizes a third multiplexer switch 80 to determine whether the increment value from the increment data input port 62, which is also 'A' bits wide, is positive or negative. The accumulator 42 then prepends 'B' bits to the most significant end of the increment data. If the sign bit is positive, all the prepended bits are logical zero's, while if the sign bit is negative, the prepended bits are logical one's. The result is A+B bits wide. Prepending these bits to the most significant end of the increment data, i.e. the data received at the increment data port 62, implements a division of the increment data value by a value N, where N equals $2^B$ and B is an integer greater than 1. Dividing the increment data value by N results in an adjusted increment value.

The adjusted increment value is then passed into the accumulator summer 86, which sums the adjusted increment value with the contents of the accumulator register 82. This summed value is passed through the second multiplexer switch 78 to the accumulator register 82 and is stored in the accumulator register 82 whenever the increment data clock signal at an increment command input 70 transitions to a logical one state. The increment data clock signal is assumed to transition to a logical one state N−1 times between the data updates at the pre-load data and increment data input ports 58 and 62. The result is a series of stair steps of equal width and height that ramp from the pre-load data value to one step in amplitude less than the sum of the pre-load data value and the increment value. In a preferred implementation, the next pre-load data value input at the pre-load data input port 58 is approximately equal to the previous pre-load data value plus the previous increment value. Alternatively, it is not necessary for the next pre-load data value input at the pre-load data input port 58 to be approximately equal to the previous pre-load data value plus the previous increment value.

Finally, the accumulator register 82 is output to a two's complement to offset binary converter and truncater function 90, which toggles the sign bit and retains only the most significant number of bits to match the number of bits available in the DAC 46 (shown in FIG. 1). Alternatively, the output of the accumulator register 82 could be passed to additional digital signal processing elements (not shown), to implement a sub-system that would then output a signal to the DAC 46.

In a preferred embodiment, the digital controller 14 is located remotely from the accumulator 42 and connected to the accumulator 42 via a data bus. In an alternate preferred implementation, the digital controller 14 resides locally to the accumulator 42. In still another form a portion of the digital controller 14 resides remotely and a portion resides locally to the accumulator 42.

Figure 3:
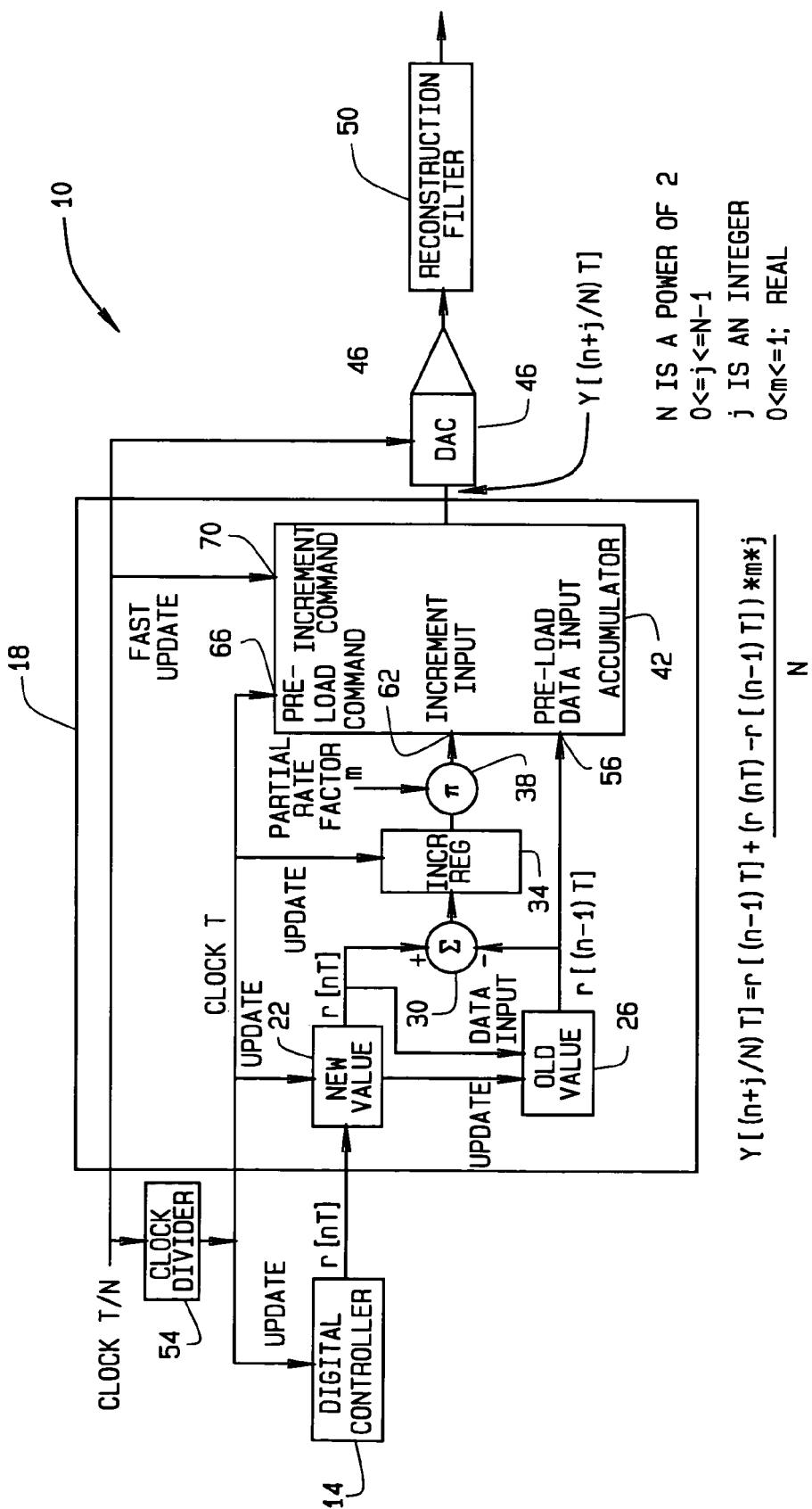
FIG. 3 is a simplified schematic of the digital control system shown in FIG. 1, illustrating a method for selecting data presented to a pre-load data input and an increment data input, in accordance with a preferred embodiment of the present invention.
Figure 4:
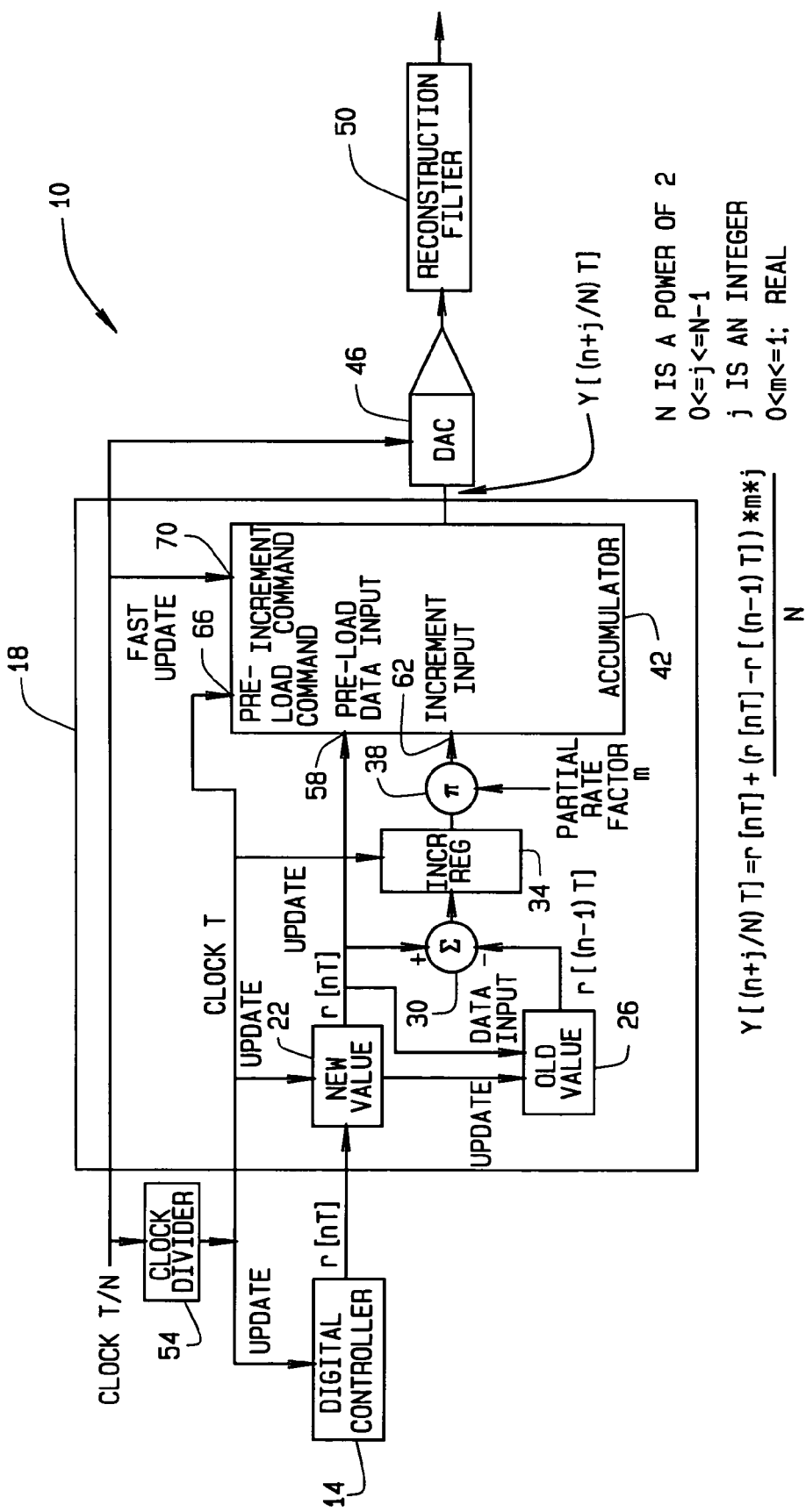
FIG. 4 is a simplified schematic of the digital control system shown in FIG. 1, illustrating a method for selecting data presented to a pre-load data input and an increment data input, in accordance with another preferred embodiment of the present invention.
Figure 5:
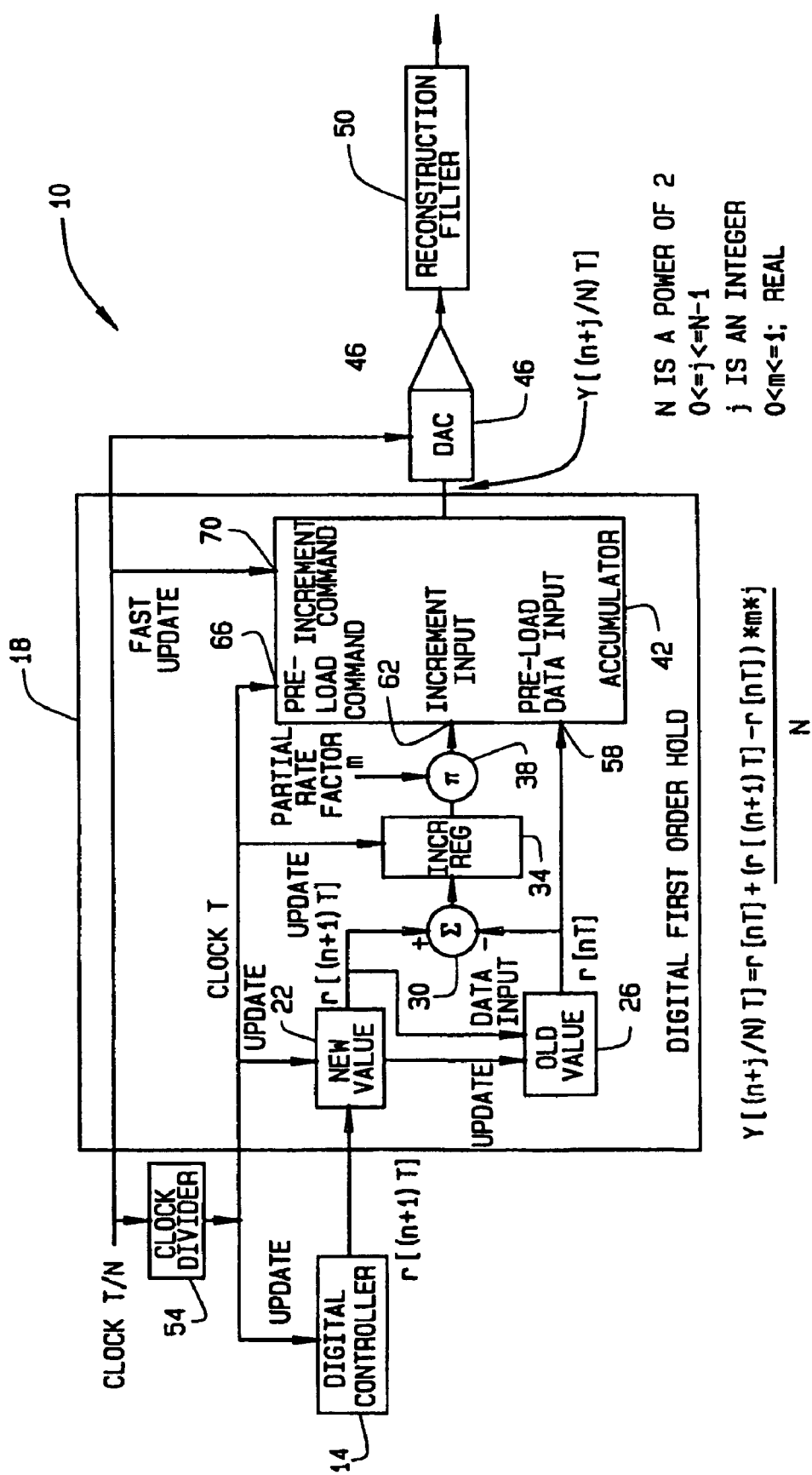
FIG. 5 is a simplified schematic of the digital control system shown in FIG. 1, illustrating a method for selecting data presented to a pre-load data input and an increment data input, in accordance with yet another preferred embodiment of the present invention.

FIGS. 3, 4 and 5 are simplified schematics that illustrate the applications of three discrete first order holds to select the data presented to the pre-load data input 58 and the increment data input 62, in accordance with various preferred implementations of the present invention.

Referring to FIG. 3, an interpolating digital first order hold is utilized to select the data presented to the pre-load data and increment data inputs 58 and 62. In this embodiment, when a new value, i.e. signal, is output from the digital controller 14, the data in the new value register 22 is moved to the old value register 26 and the new value is captured in the new value register 22. The summer 30 then determines the difference between the contents of the new value register 22 and the contents of the old value register 26. This differential value is input to, and captured by, the increment register 34. Therefore, the contents of the increment register 34 are substantially equal to:

$$(r[nT]-r[(n-1)T])/N;$$

where n=an integer$\geq$0, N=an up-sampling ratio, T=a base sample period, and r=the input signal.

In one preferred embodiment, the contents of the increment register are multiplied by a constant m to implement a partial rate first order hold, via the multiplier 38. In an interpolating digital first order hold, as utilized in FIG. 3, m is equal to one (1) so that the output of the multiplier 38 is a full rate first order hold.

The contents of the increment register 34 are passed to the increment data input port 62 and the contents of the old value register 26 are passed to the pre-load data input port 56, of the accumulator 42. In addition the accumulator 42 is provided with an increment synchronous clock command and pre-load synchronous clock command at the increment and pre-load command inputs 70 and 66. The increment command clock runs at a frequency of N times that of the pre-load command clock. Finally, an offset binary value is output from the accumulator 42 and loaded into the DAC 46. The DAC 46 converts the digital signal output from the accumulator 42 to an analog signal. The analog signal is then input to the reconstruction filter 50 where the signal is smoothed. That is, the reconstruction filter 50 attenuates any noise in the analog signal output from the DAC 46. Therefore, the signal output from the accumulator 42 is in accordance with the following equation:

$$Y[(n+j/N)T]=r[(n-1)T]+(((r[nT]-r[(n-1)T])*m*j)/N);$$

where n=an integer$\geq$0, N=an up-sampling ratio, j=an integer$\geq$0<N, T=a base sample period, r=the input signal, and m=1.

Referring to FIG. 4, a predictive digital first order hold is utilized to select the data presented to the pre-load data and increment data inputs 58 and 62. In this embodiment, when a new value, i.e. signal, is output from the digital controller 14, the data in the new value register 22 is moved to the old value register 26 and the new value is captured in the new value register 22. The summer 30 then determines the difference between the contents of the new value register 22 and the contents of the old value register 26. This differential value is input to, and captured by, the increment register 34. Therefore, the contents of the increment register 34 are substantially equal to:

$$(r[nT]-r[(n-1)T])/N;$$

where n=an integer$\geq$0, N=an up-sampling ratio, T=a base sample period, and r=the input signal.

In one preferred embodiment, the contents of the increment register are multiplied by a constant m to implement a partial rate first order hold, via the multiplier 38. If m is equal to one (1), then the output of the multiplier 38 is a full rate first order hold. Implementation of a partial rate first order hold provides less overshoot at the signal peak values and potentially more stability of signal output from the accumulator 42 to the DAC 46.

The contents of the increment register 34 are passed to the increment data input port 62 and the contents of the new value register 22 are passed to the pre-load data input port 58, of the accumulator 42. In addition the accumulator 42 is provided an increment synchronous clock command and pre-load synchronous clock command at the increment and pre-load command inputs 70 and 66. The increment command clock runs at a frequency of N times that of the pre-load command clock. Finally, an offset binary value is output from the accumulator 42 and loaded into the DAC 46. The DAC 46 converts the digital signal output from the accumulator 42 to an analog signal. The analog signal is then input to the reconstruction filter 50 where the signal is smoothed. That is, the reconstruction filer 50 attenuates any noise in the analog signal output from the DAC 46. Therefore, the signal output from the accumulator 42 is in accordance with the following equation:

$$Y[(n+j/N)T]=r[nT]+(((r[nT]-r[(n-1)T])*m*j)/N);$$

where n=an integer$\geq$0, N=an up-sampling ratio, j=an integer$\geq$0<N, T=a base sample period, r=the input signal, and m=partial rate first order hold constant.

Referring to FIG. 5, an anticipatory digital first order hold is utilized to select the data presented to the pre-load data and increment data inputs 58 and 62. In this embodiment, the digital controller 14 outputs a series of unique signals, i.e. data values, to the modulation module 18, wherein each data value is output one sample period T before the digital controller 14 makes that same data sample available to the rest of the system. The sample period T is the fixed time interval between the outputs from the digital controller 14. This embodiment represents a non-causal system in which the digital controller 14 creates a signal and outputs the signal to the modulation module 18, but suppresses the value of the signal from the rest of the system.

Other than the data being output from the digital controller 14 one frame early, the digital control system 10 functions in the same manner as the interpolating digital first order hold method described above in reference to FIG. 3. However, since the digital controller 14 outputs the signals one frame early, the value captured in the increment register 34 is substantially equal to:

$$(r[(n+1)T]-r[nT])/N);$$

where n=an integer$\geq$0, N=an up-sampling ratio, T=a base sample period, and r=the input signal.

Therefore, the signal output from the accumulator 42 is in accordance with the following equation:

$$Y[(n+j/N)T]=r[nT]+(((r[(n+1)T]-r[nT])*m*j)/N)$$

where n=an integer$\geq$0, N=an up-sampling ratio, j=an integer$\geq$0<N, T=a base sample period, r=the input signal, and m=1.

FIG. 6 is a flow chart 100 illustrating the basic functionality of the digital control system 10, in accordance with a preferred embodiment of the present invention. Initially, the digital controller 14 periodically outputs a signal, i.e. data value, at a specific frequency, as indicated at 102. The present value in the new register 22 is used to update the old value register 26 while the new value output from the digital controller 14 is used to update the new value register 22, as indicated at operations 104 and 106. The difference between the old and new values is computed and the differential value is stored in the increment register 34, as indicated at 108. The value in the increment register is then multiplied by the partial rate factor m, as indicated at 110.

Next a data value is input to the pre-load data input port 58 and a data value is input to the increment data input port 62, as indicated at 112. The sign of the data value input to the pre-load data input port 58 is determined and a specific number B of bits is appended, thereby resulting in the pre-load data value, as indicated at 114. The sign of the data value input to the increment data input port 62 is determined and a specific number B of bits is prepended, thereby resulting in the increment data value, as indicated at 116. The pre-load data value is then stored in the accumulator register 82 and output to the DAC 46, as indicated at operation 118.

The current time is then forced to not be equal to the time the new value is output from the digital controller 14, as indicated at step 120. Next, the digital control system 10 determines whether the current time is equal to an increment time that periodically occurs at a frequency greater than the output frequency of the digital controller 14, as indicated at 122. If the current time is equal to the increment time, the adjusted increment value is added to the present value stored in the accumulator register 82, as indicated a 124. Therefore, an 'updated' value is stored in the accumulator register 82. The summed value is then output to the DAC 46, as indicated at 126. An increment counter J is then incremented by one (1), as indicated at 128. Next, the digital control system 10 forces the current time to not be equal to the increment time, as indicated at 130, thereby forcing the accumulator 42 to wait until the next time increment.

The digital control system 10 then determines whether the increment counter J equals a predetermined up sampling ratio constant N that is related to the frequency of the increment register output, as indicated at 132. If the increment counter J does not equal N, the increment value is added to the 'updated' value in the accumulator register 82, as indicated at 124, and the digital control system then executes the processes indicated at 126 through 132. The processes indicated at 124 through 132 are repeated until the increment counter J equals N, as indicated at 132. At which point, a new value is received from the digital controller 14.

Therefore, the digital control system 10 inserts a number of evenly spaced output samples between each of the periodic outputs of the digital controller 14. The evenly spaced output samples are output to the DAC 46 at a second frequency that is greater than the frequency at which the digital controller 14 outputs signals. Between each new value output from the digital controller 14, the modulation module 18 executes the insertion algorithm to determine the values output to the DAC 46 based upon the current and previous outputs of the digital controller 14. Thus, the digital control system 10 combines digital up sampling, linear staircase data insertion and a zero order hold to create various digital first order holds (DFOH) that approximate various analog first order hold mechanisms, and the results are output to the reconstruction filter 50. The staircase output of the DFOH reduces the size of the steps and increases the fundamental frequency of the signal that is output to reconstruction filter 50.

While the invention has been described in terms of various specific embodiments, those skilled in the art will recognize that the invention can be practiced with modification within the spirit and scope of the claims.

What is claimed is:

1. A method using a signal processing circuit to reduce delay in signal processing of a predictive digital control system, for use in a real time control system, said method comprising:

modulating a signal output from a digital controller to create a staircase approximation of a digital first order hold (DFOH) by combining digital up sampling with linear staircase data insertion and a zero order hold to create a first order hold mechanism;

outputting the modulated signal to a digital-to-analog converter (DAC);

filtering a signal output from the DAC utilizing a reconstruction filter to attenuate noise in the signal output from the DAC;

wherein the modulating the signal output from the digital controller comprises reducing the size of the plurality of steps included in the staircase approximation, and increasing a fundamental frequency of the signal output from the digital controller, to reduce delay through the reconstruction filter while filtering digital noise from the signal; and wherein the reducing the size of the plurality of steps and increasing the fundamental frequency includes modulating the signal in accordance with at least one of the formulas:

$$Y[(n+j/N)T]=r[nT]+(((r[nT]-r[(n-1)T])*m*j)/N);$$
   and
   $$Y[(n+j/N)T]=r[nT]+(((r[(n+1)T]-r[nT])*m*j)/N)$$

where n=an integer$\geq$0, N=an up-sampling ratio, j=an integer$\geq$0<N, T=a base sample period, r=the input signal, and m=partial rate first order hold constant.

2. A method to reduce delay in using a signal processing circuit of a real time, predictive digital control system, said method comprising:

periodically receiving a value from a digital controller at a first frequency;

loading a pre-load data value into an accumulator register;

outputting the pre-load data value from the accumulator register to a digital to analog converter (DAC);

computing a step increment value comprising the difference between a current value output from the digital controller and a prior value output by the digital controller;

computing an adjusted step increment value comprising the step increment value divided by a predetermined integer;

adding the adjusted step increment value to the pre-load data value in the accumulator register to created an augmented value;

outputting the augmented value to the DAC;

at a second frequency that is greater than the first frequency, adding the adjusted step increment value to the augmented value to create subsequent augmented values;

outputting the subsequent augmented values to the DAC until a subsequent value is received from the digital controller at the first frequency; and further performing the above operations in accordance with one of the following formulas:

$$Y[(n+j/N)T]=r[nT]+(((r[nT]-r[(n-1)T])*m*j)/N);$$
   and
   $$Y[(n+j/N)T]=r[nT]+(((r[(n+1)T]-r[nT])*m*j)/N)$$

where n=an integer$\geq$0, N=an up-sampling ratio, j=an integer$\geq$0<N, T=a base sample period, r=the input signal, and m=partial rate first order hold constant.

3. The method of claim 2, wherein the pre-load data value comprises one of the current value and the prior value output from the digital controller.

4. The method of claims 2, wherein computing the step increment value comprises computing the step increment value to equal $(r[nT]-r[(n-1)T])/N$, where n=an integer$\geqq$0, N=an up-sampling ratio, T=a base sample period, and r=the input signal.

5. A method utilizing a signal processing circuit for a real time control circuit, for modulating a signal output from a digital controller and processed through a signal filter to reduce delay in the processed signal, said method comprising:

periodically receiving a new value from a digital controller at a first frequency;

updating a new value register with the new value;

updating an old value register by moving an old value from a new value register to the old value register;

loading a pre-load data value into an accumulator register;

outputting the pre-load data value from the accumulator register to a digital to analog converter (DAC);

computing a step increment value comprising the difference between the new value and the old value;

computing an adjusted step increment value comprising the step increment value divided by a predetermined integer;

computing an accumulator output value comprising the sum of the pre-load data value and the adjusted step increment value and replacing the pre-load data value in the accumulator register with the accumulator output value;

outputting the accumulator output value to the DAC; at a second frequency that is greater than the first frequency, computing at least one subsequent accumulator output value comprising the sum of the adjusted step increment value and the prior accumulator output value stored in the accumulator register and storing the subsequent accumulator value in the accumulator register; and outputting the subsequent accumulator output values to the DAC until a subsequent new value is received from the digital controller at the first frequency; and wherein computing the accumulator output value comprises computing the accumulator output value in accordance with one of the following equations:

$$Y[(n+j/N)T]=r[nT]+(((r[(n+1)T]-r[nT])*m*j)/N)$$

$$Y[(n+j/N)T]=r[nT]+(((r[nT]-r[(n-1)T])*m*j)//N)$$

where n=an integer$\geqq$0, N=an up-sampling ratio, j=an integer$\geqq$0<N, T=a base sample period, r=the input signal, and m=partial rate first order hold constant.

6. The method of claim 5, wherein the pre-load data value comprises the old value.

7. The method of claim 5, wherein the pre-load data value comprises the new value.

8. The method of claims 5, wherein computing the step increment value comprises computing the step increment value to equal $(r[nT]-r[(n-1)T])/N$, where n=an integer$\geqq$0, N=an up-sampling ratio, T=a base sample period, and r=the input signal.

\* \* \* \* \*

UNITED STATES PATENT AND TRADEMARK OFFICE
CERTIFICATE OF CORRECTION

PATENT NO. : 7,640,281 B2
APPLICATION NO. : 10/847689
DATED : December 29, 2009
INVENTOR(S) : Douglas B Kirkland Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1521 days.

Signed and Sealed this

Ninth Day of November, 2010

David J. Kappos
*Director of the United States Patent and Trademark Office*